(12) United States Patent
Higuchi et al.

(10) Patent No.: US 12,309,914 B2
(45) Date of Patent: May 20, 2025

(54) MULTILAYER CIRCUIT BOARD HAVING SIGNAL AND POWER ISOLATION CIRCUIT

(71) Applicant: Murata Manufacturing Co., Ltd., Kyoto-fu (JP)

(72) Inventors: Tarou Higuchi, Nagaokakyo (JP); Yoshihiro Imanishi, Nagaokakyo (JP); Yasushi Saito, Nagaokakyo (JP); Akio Igarashi, Nagaokakyo (JP); Minehito Yoshida, Nagaokakyo (JP); Hiroyuki Honda, Nagaokakyo (JP); Masaki Inui, Nagaokakyo (JP); Yuya Nagaoka, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 213 days.

(21) Appl. No.: 18/311,130

(22) Filed: May 2, 2023

(65) Prior Publication Data

US 2023/0276567 A1    Aug. 31, 2023

Related U.S. Application Data

(63) Continuation of application No. PCT/JP2021/037463, filed on Oct. 8, 2021.

(30) Foreign Application Priority Data

Nov. 4, 2020    (JP) ................. 2020-184488

(51) Int. Cl.
*H05K 1/02*  (2006.01)
*H05K 1/18*  (2006.01)

(52) U.S. Cl.
CPC .......... *H05K 1/0218* (2013.01); *H05K 1/181* (2013.01); *H05K 2201/1003* (2013.01)

(58) Field of Classification Search
CPC .................................... H05K 1/0218
(Continued)

(56) References Cited

U.S. PATENT DOCUMENTS 9,780,662 B1 * 10/2017 Milanesi ............... H02M 3/156
10,418,994 B1 *  9/2019 Cullen ............... H03K 19/1776
(Continued)

FOREIGN PATENT DOCUMENTS

JP    H03-71703  A1    3/1991
JP    H06-350312 A    12/1994
(Continued)

OTHER PUBLICATIONS

International Search Report issued in PCT/JP2021/037463; mailed Dec. 14, 2021.

*Primary Examiner* — Stanley Tso
(74) *Attorney, Agent, or Firm* — Studebaker Brackett PLLC

(57) ABSTRACT

A multilayer circuit board having a signal and power isolation circuit, which can suppress the capacitive coupling between a chip inductor and a ground layer below the chip inductor and also suppress the characteristic impedance change occurring in a mounting pad on a microstrip line. Portions of the inner-layer ground below both the mounting pad on the microstrip line and the chip inductors connected to the mounting pad are separately removed respectively as the signal transmission characteristic compensation removal portion, which is formed by removing a portion having a predetermined area and situated immediately below the mounting pad, and the inductor characteristic compensation removal portion, which is formed by removing a mounting-surface-below portion having a predetermined area and situated immediately below the chip inductors. The signal transmission characteristic compensation removal portion and the inductor characteristic compensation removal por- (Continued)

tion are electrically isolated from each other with the predetermined distance therebetween.

20 Claims, 7 Drawing Sheets

(58) Field of Classification Search
USPC .......................................................... 174/260
See application file for complete search history.

(56) References Cited

U.S. PATENT DOCUMENTS

| | | | |
|---|---|---|---|
| 2010/0253309 A1* | 10/2010 | Xi | H02M 3/156 |
| | | | 323/288 |
| 2011/0281474 A1* | 11/2011 | Weinmann | H01R 13/6466 |
| | | | 439/676 |
| 2016/0164491 A1* | 6/2016 | Muto | H03H 9/725 |
| | | | 333/195 |
| 2017/0170799 A1* | 6/2017 | Kong | G06F 30/392 |

FOREIGN PATENT DOCUMENTS

| | | | |
|---|---|---|---|
| JP | 10-200223 | * | 7/1998 |
| JP | H10-200223 A | | 7/1998 |
| JP | 2007-123740 A | | 5/2007 |
| JP | 2014-171154 A | | 9/2014 |
| JP | 2020-113696 A | | 7/2020 |

* cited by examiner

FIG. 2A
FIG. 2B
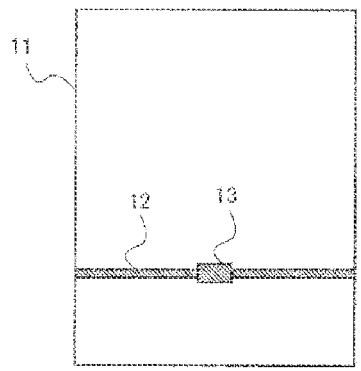
FIG. 2C
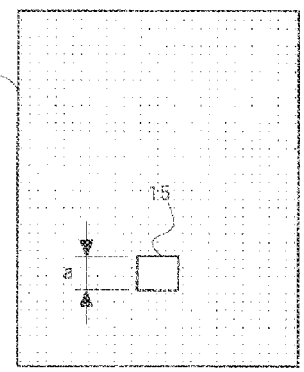
FIG. 2D
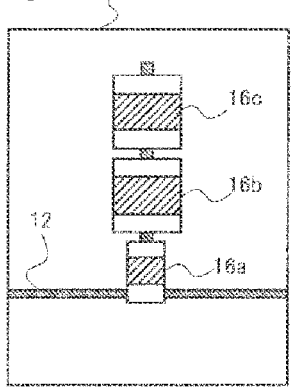
FIG. 2E
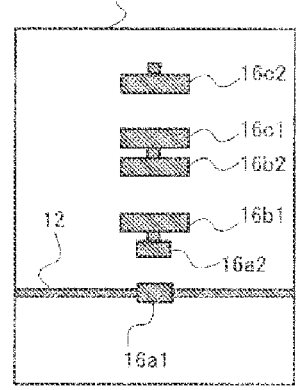
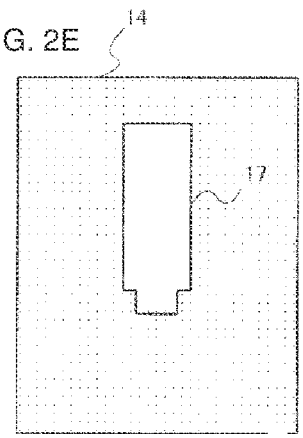
FIG. 2F
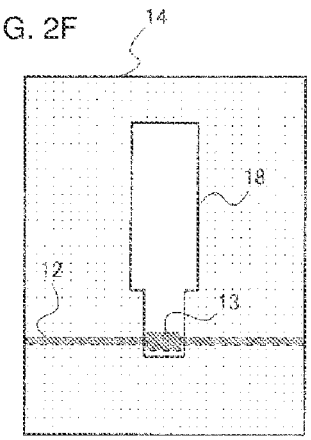

MULTILAYER CIRCUIT BOARD HAVING SIGNAL AND POWER ISOLATION CIRCUIT

CROSS-REFERENCE TO RELATED APPLICATIONS

This application claims benefit of priority to International Patent Application No. PCT/JP2021/037463, filed Oct. 8, 2021, and to Japanese Patent Application No. 2020-184488, filed Nov. 4, 2020, the entire contents of each are incorporated herein by reference.

BACKGROUND

Technical Field

The present disclosure relates to a multilayer circuit board having a signal and power isolation circuit configured such that a chip inductor is mounted between a mounting pad on a microstrip line and a power supply.

Background Art

Existing multilayer circuit boards of this type having a microstrip line include, for example, a multilayer board disclosed in Japanese Unexamined Patent Application Publication No. 3-71703. The multilayer board is provided with a soldering land pattern on the microstrip line to connect components. In this case, an inner-layer ground pattern corresponding to the soldering land pattern is removed, and a bottom-layer ground pattern corresponding to the soldering land pattern is used as a ground pattern of the microstrip line. This configuration increases the plate thickness of a portion below the soldering land pattern, and can provide the soldering land pattern such that, with the increased plate thickness, the characteristic impedance of the microstrip line does not change even when the pattern width of the soldering land pattern is increased.

Another existing multilayer circuit board of this type having a microstrip line is disclosed in Japanese Unexamined Patent Application Publication No. 2014-171154, for example. The multilayer circuit board has a microstrip line. The microstrip line includes a signal line formed on a top surface of a dielectric, a bottom-surface ground formed on a bottom surface of the dielectric, and an inner-layer ground therebetween formed in the dielectric. The inner-layer ground has a gap along the signal line. Adjusting the value of the width of the gap enables a change of the characteristic impedance of the microstrip line while keeping the width of the signal line constant. Adjusting the value of the width of the gap further enables desired setting of the line width while keeping the characteristic impedance of the microstrip line constant.

SUMMARY

In transmission technology called Power over Coax (PoC) in which a signal and DC bias power are superimposed on a single signal line formed by a microstrip line and communication is performed through the signal line, an inductor is mounted between a mounting pad formed on the microstrip line on a top surface of a multilayer circuit board and a power supply to construct a signal and power isolation circuit. In PoC, in which high-frequency and high-current signals propagate through a microstrip line, high accuracy is required for the characteristic impedance of the microstrip line, and performance that supports high current is required for an inductor component.

To achieve improved high-current supporting capability of an inductor component, the component needs to be increased in size. However, increasing the size of the inductor component also increases the size of a mounting pad for mounting the component with respect to the line width of the microstrip line. As a result, the characteristic impedance change of the microstrip line increases in the mounting pad. Accordingly, the requirement for an increase in the size of the inductor component and the requirement for an increase in the accuracy of the characteristic impedance of the microstrip line are trade-off against each other.

To address this, the technique disclosed in Japanese Unexamined Patent Application Publication No. 3-71703 for removing a portion of the inner-layer ground below the soldering land pattern and the technique disclosed in Japanese Unexamined Patent Application Publication No. 2014-171154 for adjusting the width of the gap corresponding to the removed portion of the inner-layer ground may be combined to remove a portion of the inner-layer ground, which has any dimensions and is situated below the mounting pad, to take measures for minimizing the characteristic impedance change occurring in the mounting pad.

Further, measures are typically taken to remove a portion of a ground layer below an inductor called a Bias-T inductor included in a signal and power isolation circuit in PoC to suppress the capacitive coupling between the inductor and the ground layer below the inductor. A portion of the ground layer is removed, and the capacitive coupling between the inductor and the ground layer is suppressed, thereby preventing a decrease in the impedance of the inductor and a decrease in self-resonant frequency (SR frequency) and ensuring sufficient characteristics as a Bias-T inductor.

Accordingly, to minimize the characteristic impedance change occurring in the mounting pad and suppress the capacitive coupling between the Bias-T inductor and the ground layer below the Bias-T inductor, the measures described above need to be combined to remove portions of the inner-layer ground below both the mounting pad and the inductor.

However, if a portion of the inner-layer ground is removed in the manner described above, the removed pattern is shaped to spread out on one side of the microstrip line. As a result, a portion free of the inner-layer ground is asymmetric when viewed from the microstrip line. For this reason, the measures described above can suppress the capacitive coupling between the Bias-T inductor and the ground layer below the Bias-T inductor, but cannot suppress the characteristic impedance change occurring in the mounting pad on the microstrip line.

The present disclosure has been made in view of the above, and provides a multilayer circuit board having a signal and power isolation circuit. The multilayer circuit board includes a microstrip line formed on a component mounting surface; a mounting pad formed on the microstrip line and having a wider width than a line width of the microstrip line; a chip inductor mounted on the component mounting surface in such a manner as to be electrically connected between the mounting pad and a power supply; and an inductor characteristic compensation portion formed to have a predetermined area in a mounting-surface-below portion of an inner-layer ground disposed immediately below the component mounting surface, the mounting-surface-below portion of the inner-layer ground being situated immediately below the chip inductor. The multilayer circuit board further includes a signal transmission characteristic compensation portion formed to have a predetermined area in a portion of the inner-layer ground, the portion of the inner-layer ground being situated immediately below the mounting pad, at a position separated from the inductor characteristic compensation portion by a predetermined distance in such a manner that the signal transmission characteristic compensation portion is electrically isolated from the inductor characteristic compensation portion.

With this configuration, portions of the inner-layer ground below both the mounting pad formed on the microstrip line and the chip inductor connected to the mounting pad are electrically isolated from each other such that the signal transmission characteristic compensation portion, which is formed to have a predetermined area in the portion situated immediately below the mounting pad, and the inductor characteristic compensation portion, which is formed to have a predetermined area in the mounting-surface-below portion situated immediately below the chip inductor, are separated from each other by a predetermined distance. Accordingly, while the removed portion of the inner-layer ground, which is formed by combining the signal transmission characteristic compensation portion and the inductor characteristic compensation portion, is shaped to spread out on one side of the microstrip line, the removed portion of the inner-layer ground, which is configured such that the signal transmission characteristic compensation portion is separated from the inductor characteristic compensation portion by a distance that does not affect the compensation of the signal transmission characteristic, is shaped to project substantially equally on both sides of the microstrip line when viewed from the microstrip line.

As a result, according to the present disclosure, it is possible to provide a multilayer circuit board having a signal and power isolation circuit, which can suppress the capacitive coupling between a chip inductor and a ground layer below the chip inductor and also suppress the characteristic impedance change occurring in a mounting pad on a microstrip line.

BRIEF DESCRIPTION OF THE DRAWINGS

FIGS. 2A to 2F are diagrams describing a problem of a multilayer circuit board of the related art;

DETAILED DESCRIPTION

Figure 1A:
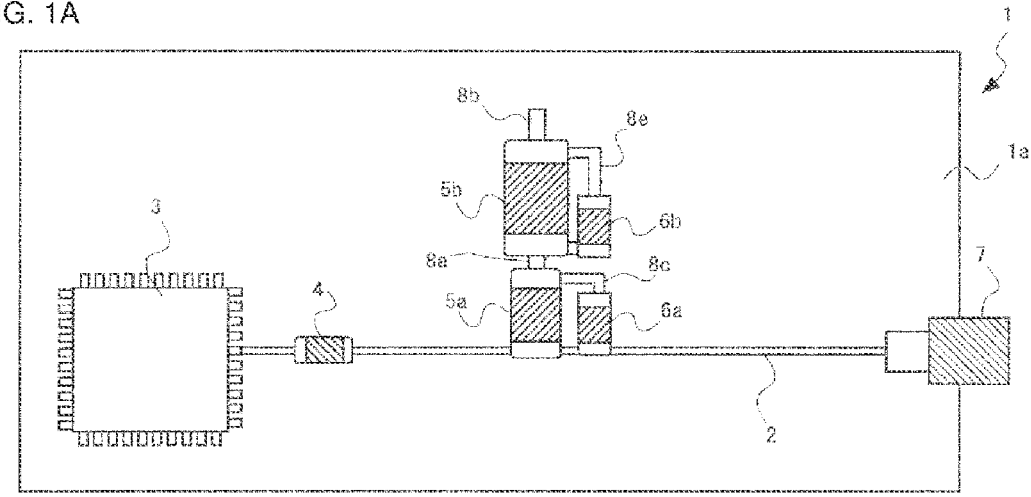
FIGS. 1A to 1C are diagrams illustrating a multilayer circuit board according to a first embodiment of the present disclosure.

Next, embodiments of a multilayer circuit board having a signal and power isolation circuit according to the present disclosure will be described. In the following description, the same or corresponding portions are denoted by the same reference numerals.

Figure 1B:
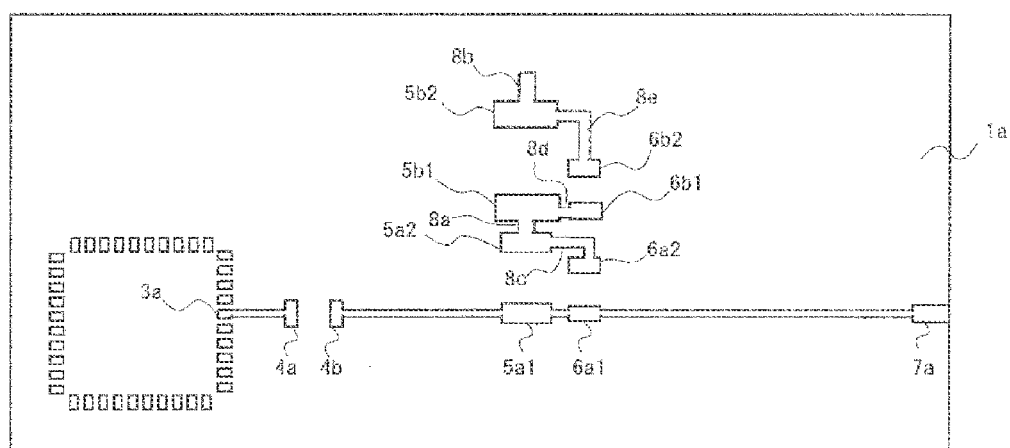
Figure 1C:
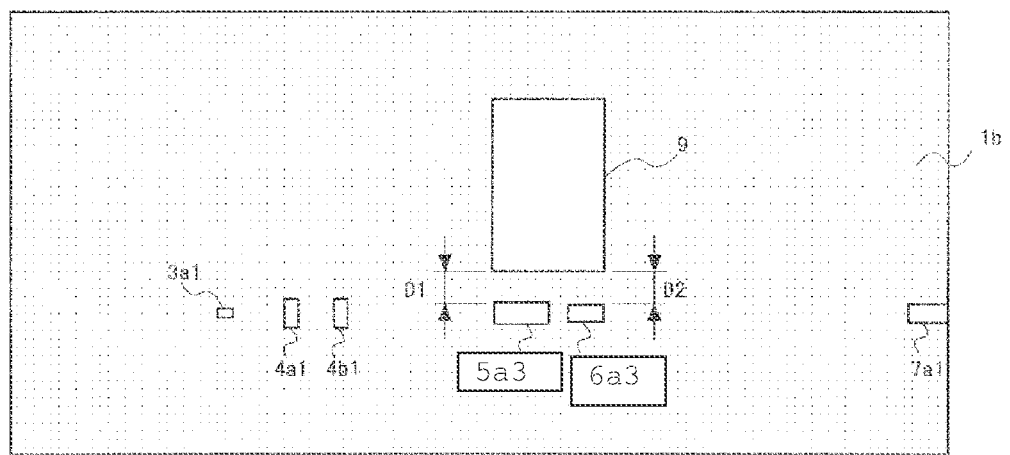

FIG. 1A is a plan view of a multilayer circuit board 1 according to a first embodiment of the present disclosure, FIG. 1B is a diagram of a surface-layer pattern that appears when components mounted on a component mounting surface 1*a* of the multilayer circuit board 1 are removed, and FIG. 1C is a pattern diagram of an inner-layer ground 1*b* situated immediately below the component mounting surface 1*a* and formed in the multilayer circuit board 1.

The component mounting surface 1*a* of the multilayer circuit board 1 has a microstrip line 2, and a highly integrated circuit (IC) 3, a DC-cut capacitor 4, chip inductors 5*a* and 5*b*, and chip resistors 6*a* and 6*b* are mounted on the component mounting surface 1*a*. A connector 7 is disposed in an end portion of the microstrip line 2, and a coaxial cable (not illustrated) is connected to the connector 7. An IC (not illustrated) is connected to the coaxial cable to communicate with the IC 3, and a radio-frequency signal propagates through the microstrip line 2. The IC 3 mounted on the component mounting surface 1*a* and the IC (not illustrated) each have formed therein a serializer/deserializer (SerDes) circuit as a communication circuit.

The chip inductors 5*a* and 5*b* are Bias-T inductors, and are connected in series using a wiring pattern 8*a* and connected in shunt with the microstrip line 2. That is, one end of the series-connected chip inductors 5*a* and 5*b* is connected to the microstrip line 2, and the other end thereof is connected to a circuit power supply (not illustrated) through a wiring pattern 8*b*. The chip resistors 6*a* and 6*b* are connected in parallel with the respective chip inductors 5 using wiring patterns 8*c*, 8*d*, and 8*e*. The number of sets of the chip inductors 5*a* and 5*b* and the chip resistors 6*a* and 6*b* may be one or three or more, and the chip resistors 6*a* and 6*b* may be omitted.

Communication using the microstrip line 2 is performed by using PoC transmission technology in which communication is performed using a single microstrip line 2 on which a signal and DC bias power are superimposed. The multilayer circuit board 1 includes a signal and power isolation circuit, which is constructed by the chip inductors 5*a* and 5*b* and the chip resistors 6*a* and 6*b*. In the PoC transmission technology, the signal and power isolation circuit isolates a signal propagating through the microstrip line 2 and a DC bias power of DC 5 [V] to be supplied to the microstrip line 2.

That is, the microstrip line 2 is supplied with DC bias power from a bias supply source (not illustrated) through the connector 7 over the coaxial cable. The signal and power isolation circuit allows the DC bias power supplied to the microstrip line 2 to pass therethrough, and uses the DC bias power having passed therethrough as the circuit power of the multilayer circuit board 1. In addition, the radio-frequency signal propagating through the microstrip line 2 is prevented from leaking to the circuit power supply. As a result, no influence can be exerted on the radio-frequency signal propagating through the microstrip line 2. The DC-cut capacitor 4 blocks the passage of DC bias power to the IC 3 and allows the transfer of radio-frequency signals between the microstrip line 2 and the IC 3. The chip resistors 6a and 6b, which are connected in parallel with the chip inductors 5a and 5b, suppress the resonance of the signal and power isolation circuit.

The circuit components are mounted on the component mounting surface 1a in such a manner that terminals thereof are electrically connected to mounting pads illustrated in FIG. 1B. That is, the chip inductor 5a has a terminal connected to a mounting pad 5a1 and another terminal connected to a mounting pad 5a3. The chip inductor 5b has a terminal connected to a mounting pad 5b1 and another terminal connected to a mounting pad 5b2. Accordingly, the series-connected chip inductors 5a and 5b are electrically connected between the mounting pad 5a1 and the circuit power supply and are mounted on the component mounting surface 1a.

The chip resistors 6a and 6b are mounted on the component mounting surface 1a in such a manner that one terminal of the chip resistor 6a is connected to a mounting pad 6a1 and the other terminal thereof is connected to a mounting pad 6a2 and one terminal of the chip resistor 6b is connected to a mounting pad 6b1 and the other terminal thereof is connected to a mounting pad 6b2. The IC 3, the capacitor 4, and the connector 7 are mounted on the component mounting surface 1a in such a manner that a terminal of the IC 3 is connected to a mounting pad 3a, terminals of the capacitor 4 are connected to mounting pads 4a and 4b, and a terminal of the connector 7 is connected to a mounting pad 7a. The mounting pads 3a, 4a, 4b, 5a1, 6a1, and 7a along the microstrip line 2 are formed to have a wider width than the line width of the microstrip line 2.

As illustrated in FIG. 1C, portions of the inner-layer ground 1b, each of which has a predetermined area and which are situated immediately below the mounting pads 3a, 4a, 4b, 5a1, 6a1, and 7a along the microstrip line 2, the chip inductors 5a and 5b, and the chip resistors 6a and 6b, are removed to form portions below. A ground pattern is formed on the entire bottom surface opposite to the component mounting surface 1a of the multilayer circuit board 1.

That is, predetermined areas of the inner-layer ground 1b are removed to form signal transmission characteristic compensation removal portions 3a1, 4a1, 4b1, 5a2, 6a2, and 7a1 in portions of the inner-layer ground 1b, which are situated immediately below the mounting pads 3a, 4a, 4b, 5a1, 6a1, and 7a, as signal transmission characteristic compensation portions. The signal transmission characteristic compensation removal portions 3a1, 4a1, 4b1, 5a3, 6a3, and 7a1 have areas equal to any predetermined areas that suppress the characteristic impedance changes of the microstrip line 2, which are caused by the mounting pads 3a, 4a, 4b, 5a1, 6a1, and 7a above the signal transmission characteristic compensation removal portions 3a1, 4a1, 4b1, 5a3, 6a3, and 7a1 projecting in the direction along the width of the microstrip line 2.

Further, predetermined areas of the inner-layer ground 1b are removed to form a component characteristic compensation removal portion 9 as a component characteristic compensation portion in a portion of the inner-layer ground 1b, which is situated immediately below the chip inductors 5a and 5b and the chip resistors 6a and 6b on the component mounting surface 1a, and in a portion of the inner-layer ground 1b, which is situated immediately below the wiring patterns 8a to 8e. The component characteristic compensation removal portion 9 has a shape in which an inductor characteristic compensation removal portion and a resistor characteristic compensation removal portion are combined. The inductor characteristic compensation removal portion is formed as an inductor characteristic compensation portion by removing a plurality of portions of the inner-layer ground 1b, each of which has a predetermined area and which are situated immediately below the chip inductors 5a and 5b on the component mounting surface 1a. The resistor characteristic compensation removal portion is formed as a resistor characteristic compensation portion by removing a plurality of portions of the inner-layer ground 1b, each of which has a predetermined area and which are situated immediately below the chip resistors 6a and 6b on the component mounting surface 1a by a predetermined area. The inductor characteristic compensation removal portion has an area equal to any predetermined area that suppresses the capacitive coupling between the chip inductors 5a and 5b located thereabove and the inner-layer ground 1b. The resistor characteristic compensation removal portion has an area equal to any predetermined area that suppresses the capacitive coupling between the chip resistors 6a and 6b located thereabove and the inner-layer ground 1b.

The component characteristic compensation removal portion 9 is formed such that the signal transmission characteristic compensation removal portion 5a2 of the mounting pad 5a1 to which the chip inductor 5a is connected is electrically isolated from the inductor characteristic compensation removal portion by a predetermined distance D1 and the signal transmission characteristic compensation removal portion 6a2 of the mounting pad 6a1 to which the chip resistor 6a is connected is electrically isolated from the resistor characteristic compensation removal portion by a predetermined distance D2. The predetermined distance D1 is set to any distance such that the inductor characteristic compensation removal portion included in the component characteristic compensation removal portion 9 does not affect the compensation of the characteristic impedance of the microstrip line 2 by the signal transmission characteristic compensation removal portion 5a2. The predetermined distance D2 is set to any distance such that the resistor characteristic compensation removal portion included in the component characteristic compensation removal portion 9 does not affect the compensation of the characteristic impedance of the microstrip line 2 by the signal transmission characteristic compensation removal portion 6a2.

In the multilayer circuit board 1 according to the present embodiment having the configuration described above, to meet the trade-off requirements, namely, an increase in the size of the inductor component and an increase in the accuracy of the characteristic impedance of the microstrip line, in the related art, as described above, the technique disclosed in Japanese Unexamined Patent Application Publication No. 3-71703 for removing a portion of the inner-layer ground below the soldering land pattern and the technique disclosed in Japanese Unexamined Patent Application Publication No. 2014-171154 for adjusting the width of the gap corresponding to a removed portion of the inner-layer ground are combined to remove a portion of the inner-layer ground, which has any dimensions and is situated below the mounting pad, to take measures for minimizing the characteristic impedance change occurring in the mounting pad.

That is, in the technique disclosed in Japanese Unexamined Patent Application Publication No. 3-71703, as illustrated in FIG. 2A, a microstrip line 12 formed on a component mounting surface 11 of a multilayer circuit board is formed with a soldering land pattern 13. Then, as illustrated in FIG. 2B, an inner-layer ground 14 has an inner-layerground-removed portion 15 formed in a portion thereof below the soldering land pattern 13.

As illustrated in FIG. 2C, for example, Bias-T inductors 16a, 16b, and 16c are connected in shunt with the microstrip line 12 formed on the component mounting surface 11 of the multilayer circuit board. In this case, as illustrated in FIG. 2D, mounting pads 16a1, 16a2, 16b1, 16b2, 16c1, and 16c2 are formed on the component mounting surface 11 to mount the Bias-T inductors 16a, 16b, and 16c on the component mounting surface 11. To suppress the capacitive coupling between the Bias-T inductors 16a, 16b, and 16c and the inner-layer ground 14 below the Bias-T inductors 16a, 16b, and 16c, as illustrated in FIG. 2E, the inner-layer ground 14 has an inner-layer-ground-removed portion 17 formed in a portion thereof below the Bias-T inductors 16a, 16b, and 16c on the component mounting surface 11.

The technique disclosed in Japanese Unexamined Patent Application Publication No. 3-71703 for suppressing the characteristic impedance change of the microstrip line 12 and the technique disclosed in Japanese Unexamined Patent Application Publication No. 2014-171154 for adjusting a gap width a (see FIG. 2B) of a removed portion of the inner-layer ground 14 may be combined to remove a portion of the inner-layer ground 14, which has any dimensions and is situated below the soldering land pattern 13, to form the inner-layer-ground-removed portion 15, thereby taking measures for minimizing the characteristic impedance change occurring in the soldering land pattern 13. The measures may be combined with the measures described above for forming the inner-layer-ground-removed portion 17 to suppress the capacitive coupling between the Bias-T inductors 16a, 16b, and 16c and the inner-layer ground 14 to remove portions of the inner-layer ground 14 below both the Bias-T inductors 16a, 16b, and 16c and the soldering land pattern 13 (the mounting pad 16a1 in FIG. 2D) in a manner as illustrated in FIG. 2F to form an inner-layer-ground-removed portion 18, thereby meeting the trade-off requirements, namely, an increase in the size of the inductor component and an increase in the accuracy of the characteristic impedance of the microstrip line.

However, in a case where a portion of the inner-layer ground 14 is removed to form the inner-layer-ground-removed portion 18 in the manner described above, as illustrated in FIG. 2F, a removal pattern of the inner-layer-ground-removed portion 18 is shaped to spread out on one side of the microstrip line 12. As a result, a portion free of the inner-layer ground 14 is asymmetric when viewed from the microstrip line 12. For this reason, the measures described above can suppress the capacitive coupling between the inductors 16a, 16b, and 16c and the inner-layer ground 14, but cannot suppress the characteristic impedance change occurring in the soldering land pattern 13, which is a mounting pad on the microstrip line 12.

Figure 3A:
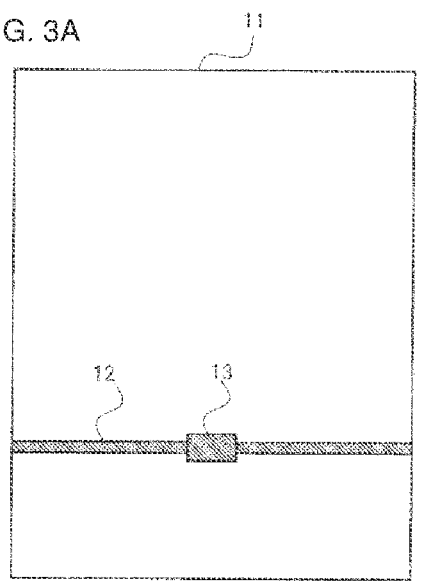
FIGS. 3A to 3D are diagrams describing the operation of the multilayer circuit board according to the first embodiment.
Figure 3B:
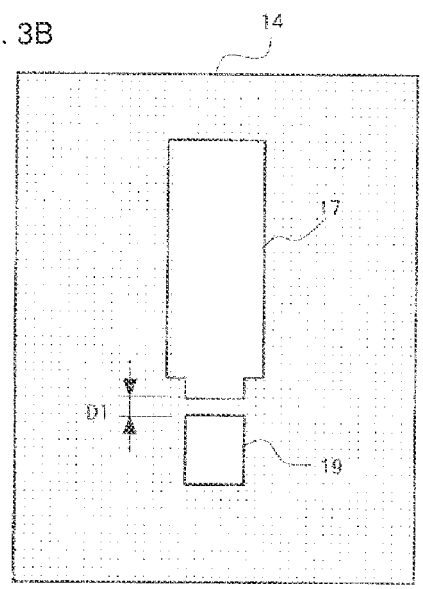

According to the present embodiment, by contrast, the inner-layer ground 14 below the mounting pad 13 on the microstrip line 12 formed on the component mounting surface 11 illustrated in FIG. 3A has an inner-layer-ground-removed portion 19, as illustrated in FIG. 3B, for compensating for the characteristic impedance change of the microstrip line 12. The inner-layer-ground-removed portion 19 is formed at a predetermined distance D1 from the inner-layer-ground-removed portion 17 for suppressing the capacitive coupling between the inductors 16a, 16b, and 16c and the inner-layer ground. That is, a conductor having the predetermined width D1 is present between the inner-layer-ground-removed portion 17 and the inner-layer-ground-removed portion 19, and the inner-layer-ground-removed portion 19 is shaped to project substantially equally on both sides of the microstrip line 12 when viewed from the microstrip line 12.

Figure 3C:
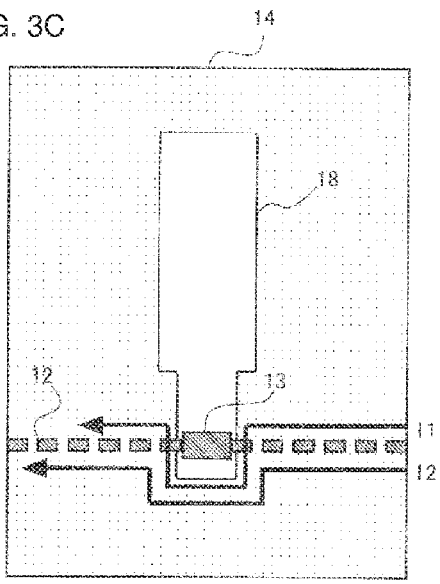

As illustrated in FIG. 3C, in a case where the inner-layer ground 14 has the inner-layer-ground-removed portion 18 having the shape illustrated in FIG. 2F, return currents I1 and I2 of a radio-frequency signal propagating along the microstrip line 12 and returning to the IC 3 through the connector 7 (see FIG. 1A) over the coaxial cable flow only under the inner-layer-ground-removed portion 18. For this reason, the current density of the return currents I1 and I2 flowing through the inner-layer ground 14 under the inner-layer-ground-removed portion 18 in the drawing increases, causing noise, which adversely affects the characteristic impedance of the microstrip line 12.

Figure 3D:
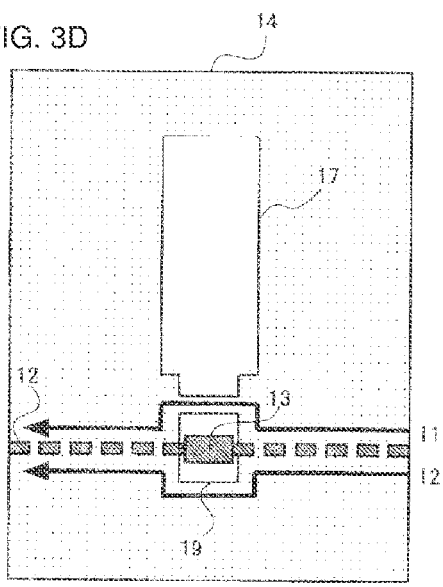

By contrast, as illustrated in FIG. 3B, in a case where the inner-layer ground 14 has the inner-layer-ground-removed portion 19 at the predetermined distance D1 from the inner-layer-ground-removed portion 17, as illustrated in FIG. 3D, the return currents I1 and I2 of a radio-frequency signal returning to the IC 3 evenly flow on both sides of the inner-layer-ground-removed portion 19. As a result, the influence of noise caused by the return currents I1 and I2 on the characteristic impedance of the microstrip line 12 is suppressed.

As described above, according to the multilayer circuit board 1 of the present embodiment described above, as illustrated in FIGS. 1A to 1C, portions of the inner-layer ground 1b below both the mounting pad 5a1 formed on the microstrip line 2 and the chip inductors 5a and 5b connected to the mounting pad 5a1 are separately removed respectively as the signal transmission characteristic compensation removal portion 5a2, which is formed by removing a portion having a predetermined area and situated immediately below the mounting pad 5a1, and the inductor characteristic compensation removal portion, which is formed by removing a mounting-surface-below portion having a predetermined area and situated immediately below the chip inductors 5a and 5b. The signal transmission characteristic compensation removal portion 5a2 and the inductor characteristic compensation removal portion are electrically isolated from each other with the predetermined distance D1 therebetween. As illustrated in FIG. 2F, the inner-layer-ground-removed portion 15 serving as the signal transmission characteristic compensation removal portion and the inner-layer-ground-removed portion 17 serving as the inductor characteristic compensation removal portion are combined to form the inner-layer-ground-removed portion 18, which spreads out on one side of the microstrip line 12. In the present embodiment, by contrast, as illustrated in FIG. 1C, the signal transmission characteristic compensation removal portion 5a2 is separated from the inductor characteristic compensation removal portion included in the component characteristic compensation removal portion 9 by the distance D1, which does not affect the compensation of the signal transmission characteristic. The signal transmission characteristic compensation removal portion 5a2 is shaped to project substantially equally on both sides of the microstrip line 2 when viewed from the microstrip line 2. As a result, it is possible to provide the multilayer circuit board 1 having the signal and power isolation circuit, which can suppress the capacitive coupling between the chip inductors 5a and 5b and the inner-layer ground 1b and also suppress the characteristic impedance change occurring in the mounting pad 5a1 on the microstrip line 2.

In the multilayer circuit board 1 of the present embodiment, furthermore, the plurality of chip inductors 5a and 5b are disposed in series on the component mounting surface 1a between the mounting pad 5a1 and the circuit power supply, and the inductor characteristic compensation removal portion is formed by removing a plurality of mounting-surface-below portions of the inner-layer ground 1b, each of which has a predetermined area and which are situated immediately below the chip inductors 5a and 5b. As a result, it is possible to suppress the capacitive coupling between the plurality of chip inductors 5a and 5b and the inner-layer ground 1b below the chip inductors 5a and 5b and also to suppress the characteristic impedance change occurring in the mounting pad 5a1 on the microstrip line 2.

In the multilayer circuit board 1 of the present embodiment, furthermore, the microstrip line 2 has, in addition to the mounting pad 5a1 of the chip inductor 5a, the other mounting pads 3a, 4a, 4b, 6a1, and 7a, which have a wider width than the line width of the microstrip line 2, at one or more positions different from the position of the mounting pad 5a1. The multilayer circuit board 1 further includes the signal transmission characteristic compensation removal portions 3a1, 4a1, 4b1, 6a2, and 7a1, which are formed by removing portions of the inner-layer ground 1b, each of which has a predetermined area and which are situated immediately below the other mounting pads 3a, 4a, 4b, 6a1, and 7a. The multilayer circuit board 1 of the present embodiment further includes the similar signal transmission characteristic compensation removal portions 3a1, 4a1, 4b1, 6a2, and 7a1 in the portions of the inner-layer ground 1b immediately below the other mounting pad 3a, 4a, 4b, 6a1, and 7a, thereby suppressing the characteristic impedance changes over the entire microstrip line 2. As a result, the signal transmission characteristic of the entire circuit including the microstrip line 2 is improved.

In the multilayer circuit board 1 of the present embodiment, furthermore, the chip resistors 6a and 6b are connected in parallel with the chip inductors 5a and 5b to suppress the resonance of the circuit. Further, portions of the inner-layer ground 1b below both the other mounting pad 6a1 for a chip resistor and the chip resistors 6a and 6b connected to the other mounting pad 6a1 are separately removed respectively as the signal transmission characteristic compensation removal portion 6a2, which is formed by removing a portion having a predetermined area and situated immediately below the other mounting pad 6a1 for a chip resistor, and the resistor characteristic compensation removal portion, which is formed in the component characteristic compensation removal portion 9 by removing a mounting-surface-below portion having a predetermined area and situated immediately below the chip resistors 6a and 6b. The signal transmission characteristic compensation removal portion 6a2 and the resistor characteristic compensation removal portion are electrically isolated from each other with the predetermined distance D2 therebetween. Accordingly, the signal transmission characteristic compensation removal portion 6a2 immediately below the other mounting pad 6a1 for a chip resistor is separated from the resistor characteristic compensation removal portion formed in the component characteristic compensation removal portion 9 by the distance D2, which does not affect the compensation of the signal transmission characteristic, and is shaped to project substantially equally on both sides of the microstrip line 2 when viewed from the microstrip line 2. As a result, it is possible to suppress the capacitive coupling between the chip resistors 6a and 6b and the inner-layer ground 1b and also to suppress the characteristic impedance change of the microstrip line 2, which occurs in the other mounting pad 6a1 for a chip resistor.

Figure 4A:
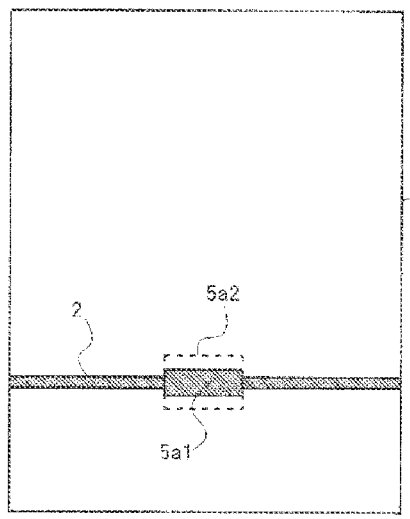
FIGS. 4A to 4C are diagrams describing a distance between a signal transmission characteristic compensation removal portion and an inductor characteristic compensation removal portion of the multilayer circuit board according to the first embodiment.
Figure 4B:
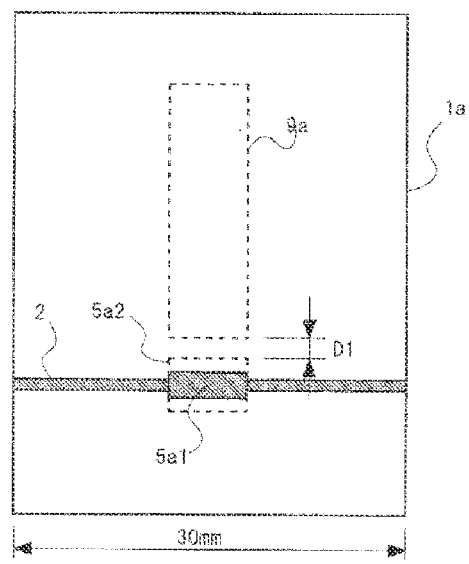

FIG. 4A illustrates an initial state in which the signal transmission characteristic compensation removal portion 5a2 is formed below the mounting pad 5a1 formed on the microstrip line 2. FIG. 4B illustrates a state according to the present embodiment in which, in addition to the initial state illustrated in FIG. 4A, an inductor characteristic compensation removal portion 9a is formed below the chip inductors 5a and 5b so as to be separated from the signal transmission characteristic compensation removal portion 5a2 by the distance D1.

Figure 4C:
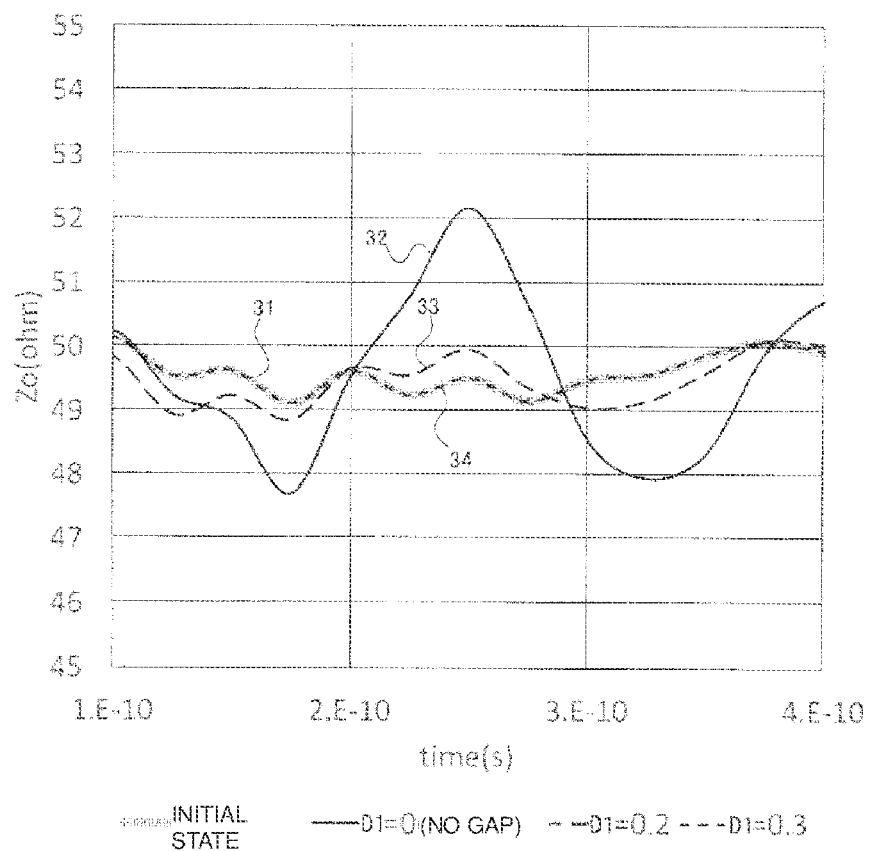

FIG. 4C is a graph illustrating simulation results of the characteristic impedance of the microstrip line 2, which is simulated by a time domain reflectometer (TDR) in response to a change of the distance D1 when the length of the microstrip line 2 in FIG. 4B is set to 30 [mm] as illustrated in the drawing. Here, the relative dielectric constant εr of a dielectric disposed between layers of the multilayer circuit board 1 was set to 4.25, the line width of the microstrip line 2 was set to 0.43 [mm], the dimensions of width×length of the mounting pad 5a1 were set to 0.9 [mm]×2.2 [mm], the dimensions of width×length of the inductor characteristic compensation removal portion 9a were set to 1.6 [mm]×2.2 [mm], and the interlayer thickness between the component mounting surface 1a and the inner-layer ground 1b was set to 0.05 [mm]. Similar dimensions were set in simulations described below.

In the graph, the horizontal axis represents time[s], and the vertical axis represents the characteristic impedance value [Ω] of the microstrip line 2. The time on the horizontal axis corresponds to the position of each portion in the extending direction of the microstrip line 2, and the range from about $2\times e^{-10}$ to $2.8\times e^{-10}$ approximately corresponds to the width of the mounting pad 5a1. A characteristic line 31 indicated by a light-black thick solid line represents a simulation result in the initial state illustrated in FIG. 4A in which the inductor characteristic compensation removal portion 9a illustrated in FIG. 4B is not formed. A characteristic line 32 indicated by a thin solid line represents a simulation result in a state in which D1=0 is set such that the signal transmission characteristic compensation removal portion 5a2 and the inductor characteristic compensation removal portion 9a are integrated without a gap therebetween. A characteristic line 33 indicated by a long dashed line represents a simulation result in the case of D1=0.2 [mm]. A characteristic line 34 indicated by a short dashed line represents a simulation result in the case of D1=0.3 [mm].

In the graph, the characteristic line 32 indicated by the solid line indicates that the characteristic impedance value greatly jumps in the center portion of the mounting pad 5a1 in the case of D1=0. This is because, when D1=0 is set such that the signal transmission characteristic compensation removal portion 5a2 and the inductor characteristic compensation removal portion 9a are integrated with each other, the inner-layer-ground-removed portion below the mounting pad 5a1 is shaped to spread out on one side when viewed from the microstrip line 2. Further, the characteristic line 33 indicated by the long dashed line indicates that, when D1=0.2 [mm] is set such that the signal transmission characteristic compensation removal portion 5a2 is separated from the inductor characteristic compensation removal portion 9a by 0.2 [mm], the characteristic impedance value changes within the range of ±0.5 [Ω] with respect to the initial state represented by the characteristic line 31 indicated by the light-black thick solid line. Further, the characteristic line 34 indicated by the short dashed line indicates that, when D1=0.3 [mm] is set such that the signal transmission characteristic compensation removal portion 5a2 is separated from the inductor characteristic compensation removal portion 9a by 0.3 [mm], the characteristic impedance value matches that in the initial state represented by the characteristic line 31 indicated in thick light-black color.

The simulation results indicate that no problem may occur when the signal transmission characteristic compensation removal portion 5a2 is separated from the inductor characteristic compensation removal portion 9a by 0.2 [mm] and that the signal transmission characteristic compensation removal portion 5a2 is not affected at all by the inductor characteristic compensation removal portion 9a adjacent thereto when the signal transmission characteristic compensation removal portion 5a2 is separated from the inductor characteristic compensation removal portion 9a by 0.3 [mm]. The same can be applied to the relationship between the signal transmission characteristic compensation removal portion 6a2 and the resistor characteristic compensation removal portion for the chip resistors 6a and 6b.

Figure 5A:
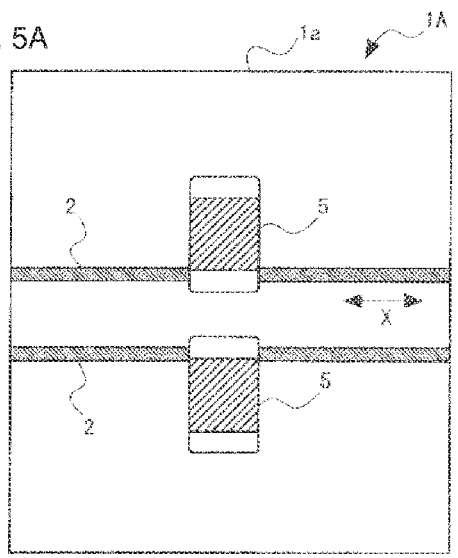
FIGS. 5A and 5B are diagrams illustrating a multilayer circuit board according to a second embodiment of the present disclosure.
Figure 5B:
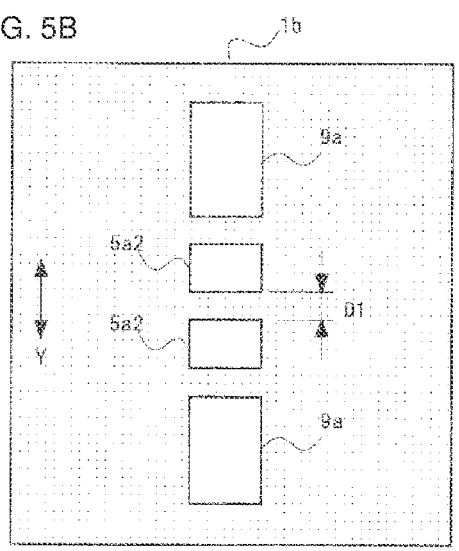

FIG. 5A is a plan view of chip inductors 5 on a multilayer circuit board 1A according to a second embodiment of the present disclosure, and FIG. 5B is a pattern diagram of mounting-surface-below portions of an inner-layer ground 1b formed inside the multilayer circuit board 1A, which are situated immediately below the chip inductors 5. In the multilayer circuit board 1A according to the second embodiment, two microstrip lines 2 each having the configuration of the first embodiment are formed on the multilayer circuit board 1A, and a single inductor 5 is used instead of the series-connected chip inductors 5a and 5b described in the first embodiment described above. The microstrip lines 2 are connected to the IC 3 through DC-cut capacitors 4 illustrated in FIG. 1A.

In the present embodiment, the component mounting surface 1a has the chip inductors 5 arranged on both sides of the two parallel microstrip lines 2. Further, the inner-layer ground 1b below the mounting pads 5a1 formed on the respective microstrip lines 2 and each connected to one end of a corresponding one of the chip inductors 5 has the signal transmission characteristic compensation removal portions 5a2 arranged side by side in respective extending directions X of the two microstrip lines 2 such that the signal transmission characteristic compensation removal portions 5a2 are separated from each other by a predetermined distance D1 in a direction Y orthogonal to the respective extending directions X.

From the simulation results illustrated in FIGS. 4A to 4C, no problem may occur in the characteristic impedances of the microstrip lines 2 when the signal transmission characteristic compensation removal portions 5a2 are separated from each other by the predetermined distance D1=0.2 [mm]. In addition, it is considered that the signal transmission characteristic compensation removal portions 5a2, which are adjacent to each other, are not affected at all when the signal transmission characteristic compensation removal portions 5a2 are separated from each other by 0.3 [mm]. As a result, the distance D1 is preferably set to 0.2 [mm] or more.

According to the multilayer circuit board 1A of the second embodiment, the distance between the chip inductors 5 formed on the respective microstrip lines 2 and the distance between the microstrip lines 2 can be set to the minimum with the characteristic impedance changes of the respective microstrip lines 2 suppressed. Since the distance between the chip inductors 5 and the distance between the microstrip lines 2 can be reduced, the size of the multilayer circuit board 1A can be reduced with increased mounting density of the components of the multilayer circuit board 1A.

Figure 6A:
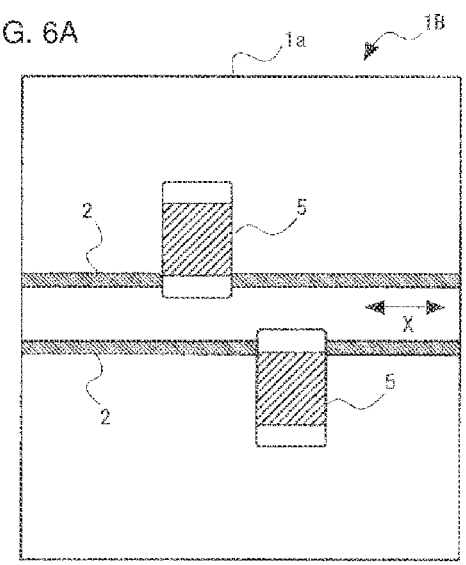
FIGS. 6A and 6B are diagrams illustrating a multilayer circuit board according to a third embodiment of the present disclosure.
Figure 6B:
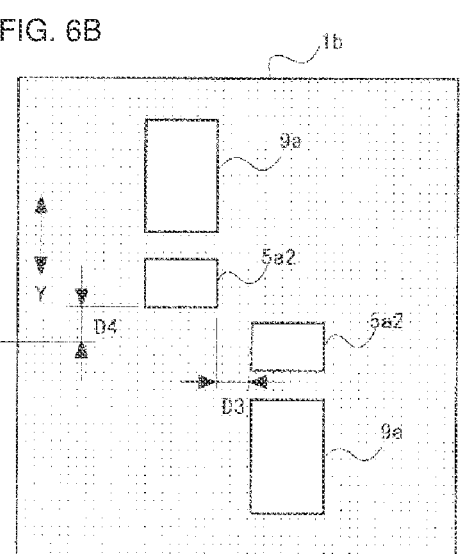

FIG. 6A is a plan view of chip inductors 5 on a multilayer circuit board 1B according to a third embodiment of the present disclosure, and FIG. 6B is a pattern diagram of mounting-surface-below portions of an inner-layer ground 1b formed inside the multilayer circuit board 1B, which are situated immediately below the chip inductors 5. Also in the multilayer circuit board 1B according to the third embodiment, two microstrip lines 2 each having the configuration of the first embodiment are formed on the multilayer circuit board 1B, and a single inductor 5 is used instead of the series-connected chip inductors 5a and 5b described in the first embodiment described above. The microstrip lines 2 are connected to the IC 3 through DC-cut capacitors 4 illustrated in FIG. 1A.

Also in the present embodiment, the component mounting surface 1a has the chip inductors 5 arranged on both sides of the two parallel microstrip lines 2. The signal transmission characteristic compensation removal portions 5a2 are arranged below the mounting pads 5a1 formed on the respective microstrip lines 2 and each connected to one end of a corresponding one of the chip inductors 5, such that one of the signal transmission characteristic compensation removal portions 5a2 below one of the mounting pads 5a1 is located at a position shifted from the other signal transmission characteristic compensation removal portion 5a2 and separated from the other signal transmission characteristic compensation removal portion 5a2 by a predetermined distance D3 in respective extending directions X of the two microstrip lines 2 and is separated from one of the microstrip lines 2 having the other mounting pad 5a1 by a predetermined distance D4 in a direction Y orthogonal to the respective extending directions X.

Figure 7A:
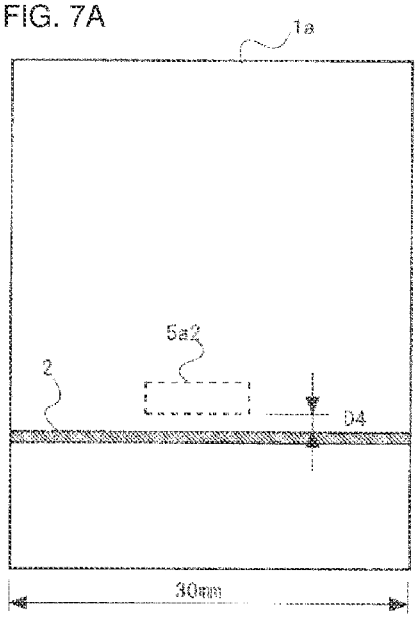
FIGS. 7A and 7B are diagrams describing a distance between a signal transmission characteristic compensation removal portion and a microstrip line of the multilayer circuit board according to the third embodiment.
Figure 7B:
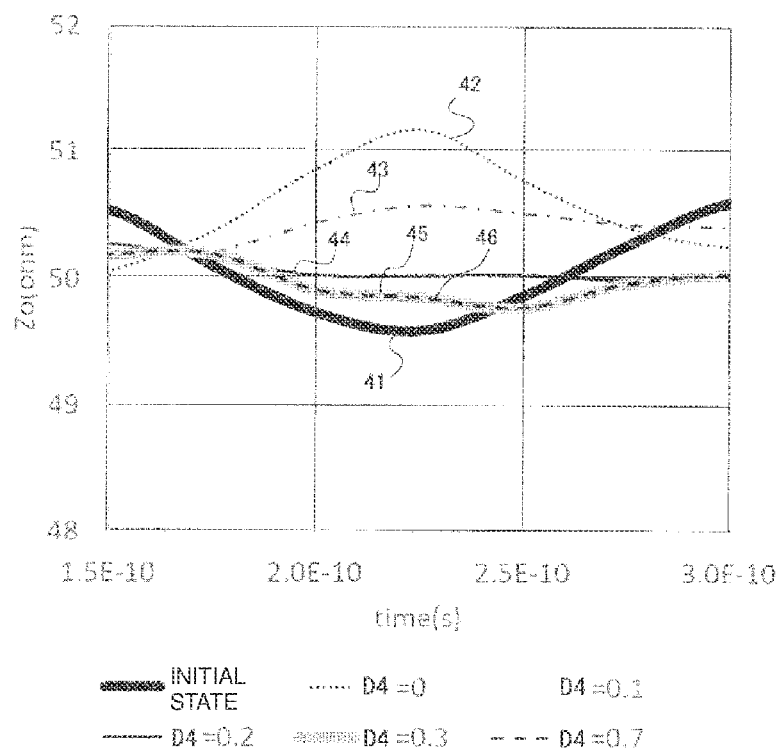

FIG. 7A illustrates the one microstrip line 2 and one of the signal transmission characteristic compensation removal portions 5a2 illustrated in FIGS. 6A and 6B. FIG. 7B is a graph illustrating simulation results of the characteristic impedance of the microstrip line 2, which is simulated by a time domain reflectometer (TDR) in response to a change of the distance D4 between the microstrip line 2 and the signal transmission characteristic compensation removal portion 5a2 when the length of the microstrip line 2 is set to 30 [mm] as illustrated in FIG. 7A.

Also in the graph, the horizontal axis represents time[s], and the vertical axis represents the characteristic impedance value [Ω] of the microstrip line 2. The time on the horizontal axis corresponds to the position of each portion in the extending direction of the microstrip line 2. A characteristic line 41 indicated by a black thick solid line represents a simulation result in an initial state in which the signal transmission characteristic compensation removal portion 5a2 illustrated in FIG. 7A is not formed. A characteristic line 42 indicated by a short dashed line represents a simulation result in a state in which D4=0 is set such that the signal transmission characteristic compensation removal portion 5a2 and the microstrip line 2 are in contact with each other without a gap therebetween. A characteristic line 43 indicated by a dash-dot line represents a simulation result in the case of D4=0.1 [mm]. A characteristic line 44 indicated by a thin solid line represents a simulation result in the case of D4=0.2 [mm]. A characteristic line 45 indicated by a light-black thick solid line represents a simulation result in the case of D4=0.3 [mm]. A characteristic line 46 indicated by a long dashed line represents a simulation result in the case of D4=0.7 [mm].

In the graph, the characteristic line 41 indicated by the black thick solid line and the characteristic line 42 indicated by the short dashed line indicate that the characteristic impedance value greatly jumps in the center portion of the signal transmission characteristic compensation removal portion 5a2 in the initial state and in the case of D4=0. The characteristic lines 43, 44, 45, and 46 indicate that the characteristic impedance approaches the characteristic line 41 in the initial state as the distance D4 increases to D4=0.1 [mm], 0.2 [mm], 0.3 [mm], and 0.7 [mm] and that the difference from the characteristic impedance in the initial state becomes less than 1 [Ω] in the case of D4=0.2 [mm] or more. As a result, the distance D4 is preferably set to 0.2 [mm] or more.

Figure 8A:
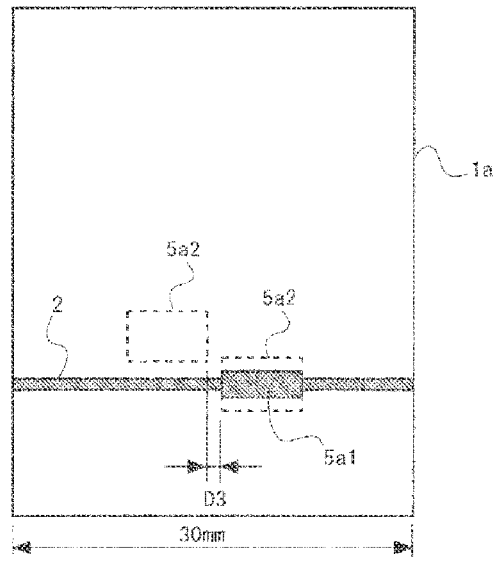
FIGS. 8A and 8B are diagrams describing a distance between signal transmission characteristic compensation removal portions of the multilayer circuit board according to the third embodiment.
Figure 8B:
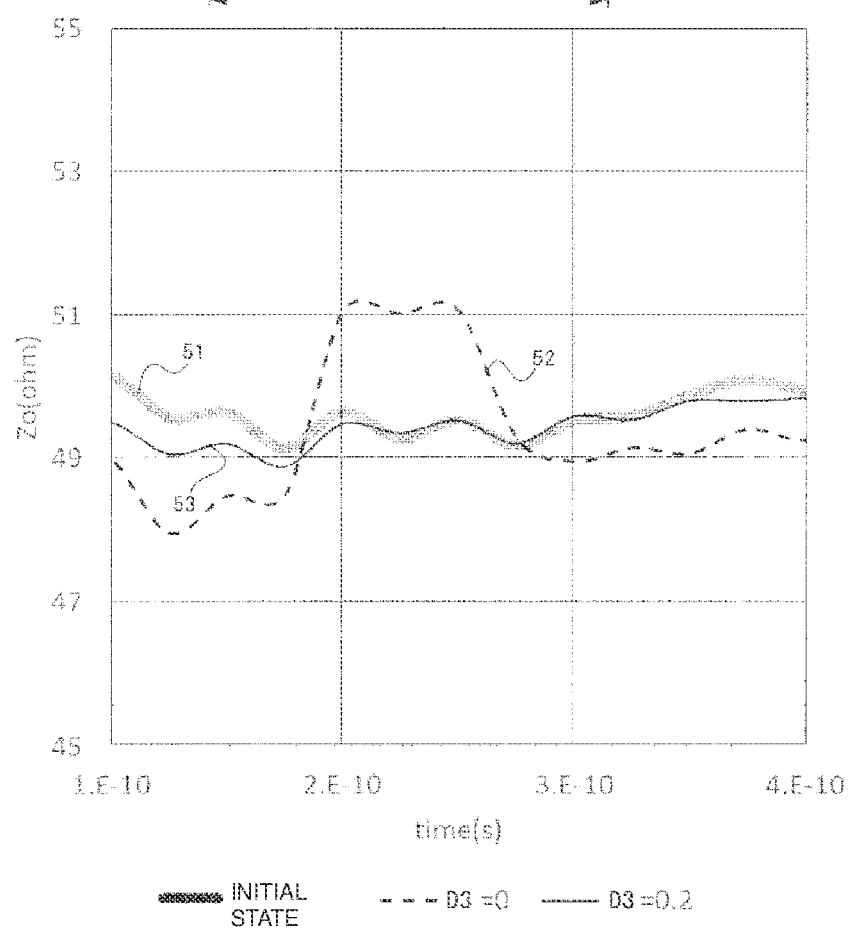

FIG. 8A illustrates the other mounting pad 5a1 formed on the one microstrip line 2 illustrated in FIGS. 6A and 6B, the other signal transmission characteristic compensation removal portion 5a2 disposed below the other mounting pad 5a1, and the one signal transmission characteristic compensation removal portion 5a2 disposed below the one mounting pad 5a1 (not illustrated). FIG. 8B is a graph illustrating simulation results of the characteristic impedance of the microstrip line 2, which is simulated by a time domain reflectometer (TDR) in response to a change of the distance D3 between the signal transmission characteristic compensation removal portions 5a2 when the length of the microstrip line 2 is set to 30 [mm] as illustrated in FIG. 8A.

Also in the graph, the horizontal axis represents time[s], and the vertical axis represents the characteristic impedance value [Ω] of the microstrip line 2. The time on the horizontal axis corresponds to the position of each portion in the extending direction X of the microstrip line 2. A characteristic line 51 indicated by a light-black thick solid line represents a simulation result in an initial state in which the one signal transmission characteristic compensation removal portion 5a2 disposed below the one mounting pad 5a1 (not illustrated) illustrated in FIG. 8A is not formed. A characteristic line 52 indicated by a dashed line represents a simulation result in a state in which D3=0 is set such that the signal transmission characteristic compensation removal portions 5a2 are in contact with each other without a gap therebetween. A characteristic line 53 indicated by a solid line represents a simulation result in the case of D3=0.2 [mm].

In the graph, the characteristic line 52 indicated by the dashed line indicates that the characteristic impedance value greatly jumps in the vicinity between the signal transmission characteristic compensation removal portions 5a2 in the case of D3=0. Further, the characteristic line 53 indicated by the solid line indicates that, when D3=0.2 [mm] is set such that the signal transmission characteristic compensation removal portions 5a2 are separated from each other by 0.2 [mm], the characteristic impedance value approximately matches that in the initial state represented by the characteristic line 51 indicated by the light-black thick solid line. As a result, the distance D3 is also preferably set to 0.2 [mm] or more.

According to the multilayer circuit board 1B of the third embodiment, the distance D3 between the chip inductors 5 formed on the respective microstrip lines 2 and the distance between the microstrip lines 2 can further be reduced with the characteristic impedance changes of the respective microstrip lines 2 suppressed. Since the distance D3 between the chip inductors 5 and the distance between the microstrip lines 2 can further be reduced, the size of the multilayer circuit board 1B can further be reduced with further increased mounting density of the components of the multilayer circuit board 1B.

In the description of the embodiments described above, the signal transmission characteristic compensation removal portion 5a2 and the inductor characteristic compensation removal portion 9a are formed by removing portions of the inner-layer ground 1b. Alternatively, both or one of the signal transmission characteristic compensation removal portion 5a2 and the inductor characteristic compensation removal portion 9a may be configured such that a conductive mesh in which conductors are positioned in a mesh with an interlayer dielectric interposed therebetween is formed in a removed portion of the inner-layer ground 1b. Alternatively, both or one of the signal transmission characteristic compensation removal portion 5a2 and the inductor characteristic compensation removal portion 9a may be configured such that a resistive film is formed in a removed portion of the inner-layer ground 1b. Alternatively, both or one of the signal transmission characteristic compensation removal portion 5a2 and the inductor characteristic compensation removal portion 9a may be configured such that one or a plurality of floating island-shaped conductors insulated from the inner-layer ground 1b are partially formed in a removed portion of the inner-layer ground 1b. Even with the configurations described above, the multilayer circuit boards 1, 1A, and 1B exhibit operational effects similar to those of the embodiments described above. In addition, the configurations described above can further address the noise caused by the return currents I1 and I2 described with reference to FIG. 3c.

What is claimed is:

1. A multilayer circuit board having a signal and power isolation circuit, comprising:
   a microstrip line on a component mounting surface;
   a mounting pad on the microstrip line and having a wider width than a line width of the microstrip line;
   at least one chip inductor mounted on the component mounting surface and electrically connected between the mounting pad and a power supply;
   an inductor characteristic compensation portion having a predetermined area in a mounting-surface-below portion of an inner-layer ground disposed immediately below the component mounting surface, the mounting-surface-below portion of the inner-layer ground being situated immediately below the chip inductor; and
   a signal transmission characteristic compensation portion having a predetermined area in a portion of the inner-layer ground, the portion of the inner-layer ground being situated immediately below the mounting pad, at a position separated from the inductor characteristic compensation portion by a predetermined distance such that the signal transmission characteristic compensation portion is electrically isolated from the inductor characteristic compensation portion.

2. The multilayer circuit board according to claim 1, wherein
   the chip inductor comprises a plurality of chip inductors disposed, on the component mounting surface, in series between the mounting pad and the power supply, and
   the inductor characteristic compensation portion has a predetermined area over a plurality of mounting-surface-below portions of the inner-layer ground, the plurality of mounting-surface-below portions of the inner-layer ground being situated immediately below the plurality of chip inductors.

3. The multilayer circuit board according to claim 1, wherein
the microstrip line includes, in addition to the mounting pad, an other mounting pad having a wider width than the line width of the microstrip line at one or more positions different from a position of the mounting pad, and
the multilayer circuit board further comprises a signal transmission characteristic compensation portion having a predetermined area in a portion of the inner-layer ground, the portion of the inner-layer ground being situated immediately below the other mounting pad.

4. The multilayer circuit board according to claim 3, comprising:
a chip resistor mounted on the component mounting surface in parallel with the chip inductor, the chip resistor having a terminal connected to the other mounting pad for the chip resistor; and
a resistor characteristic compensation portion having a predetermined area in a mounting-surface-below portion of the inner-layer ground, the mounting-surface-below portion of the inner-layer ground being situated immediately below the chip resistor, wherein
the signal transmission characteristic compensation portion for the chip resistor has a predetermined area in a portion of the inner-layer ground, the portion of the inner-layer ground being situated immediately below the other mounting pad for the chip resistor, at a position separated from the resistor characteristic compensation portion by a predetermined distance such that the signal transmission characteristic compensation portion for the chip resistor is electrically isolated from the resistor characteristic compensation portion.

5. The multilayer circuit board according to claim 1, wherein
the chip inductor comprises chip inductors on both sides of two microstrip lines arranged in parallel, each of the two microstrip lines comprising the microstrip line, and
the signal transmission characteristic compensation portion comprises signal transmission characteristic compensation portions at positions aligned in respective extending directions of the two microstrip lines and separated from each other by a predetermined distance in a direction orthogonal to the respective extending directions, the signal transmission characteristic compensation portions being situated below mounting pads on the microstrip lines, each of the mounting pads comprising the mounting pad and being connected to an end of a corresponding one of the chip inductors.

6. The multilayer circuit board according to claim 1, wherein
the chip inductor comprises chip inductors on both sides of two microstrip lines arranged in parallel, each of the two microstrip lines comprising the microstrip line, and
the signal transmission characteristic compensation portion comprises signal transmission characteristic compensation portions below mounting pads on the microstrip lines, each of the mounting pads comprising the mounting pad and being connected to an end of a corresponding one of the chip inductors, such that one of the signal transmission characteristic compensation portions below one of the mounting pads is located at a position shifted from an other of the signal transmission characteristic compensation portions and separated from the other of the signal transmission characteristic compensation portions by a predetermined distance in respective extending directions of the two microstrip lines and is separated from one of the microstrip lines having an other of the mounting pads in a direction orthogonal to the respective extending directions.

7. The multilayer circuit board according to claim 1, wherein
both or one of the signal transmission characteristic compensation portion and the inductor characteristic compensation portion includes a conductive mesh in which conductors are positioned in a mesh with a dielectric interposed therebetween.

8. The multilayer circuit board according to claim 1, wherein
both or one of the signal transmission characteristic compensation portion and the inductor characteristic compensation portion includes a resistive film.

9. The multilayer circuit board according to claim 1, wherein
both or one of the signal transmission characteristic compensation portion and the inductor characteristic compensation portion partially includes one or a plurality of floating island-shaped conductors insulated from the inner-layer ground.

10. The multilayer circuit board according to claim 2, wherein
the microstrip line includes, in addition to the mounting pad, an other mounting pad having a wider width than the line width of the microstrip line at one or more positions different from a position of the mounting pad, and
the multilayer circuit board further comprises a signal transmission characteristic compensation portion having a predetermined area in a portion of the inner-layer ground, the portion of the inner-layer ground being situated immediately below the other mounting pad.

11. The multilayer circuit board according to claim 2, wherein
the chip inductor comprises chip inductors on both sides of two microstrip lines arranged in parallel, each of the two microstrip lines comprising the microstrip line, and
the signal transmission characteristic compensation portion comprises signal transmission characteristic compensation portions at positions aligned in respective extending directions of the two microstrip lines and separated from each other by a predetermined distance in a direction orthogonal to the respective extending directions, the signal transmission characteristic compensation portions being situated below mounting pads on the microstrip lines, each of the mounting pads comprising the mounting pad and being connected to an end of a corresponding one of the chip inductors.

12. The multilayer circuit board according to claim 3, wherein
the chip inductor comprises chip inductors on both sides of two microstrip lines arranged in parallel, each of the two microstrip lines comprising the microstrip line, and
the signal transmission characteristic compensation portion comprises signal transmission characteristic compensation portions at positions aligned in respective extending directions of the two microstrip lines and separated from each other by a predetermined distance in a direction orthogonal to the respective extending directions, the signal transmission characteristic compensation portions being situated below mounting pads on the microstrip lines, each of the mounting pads comprising the mounting pad and being connected to an end of a corresponding one of the chip inductors.

13. The multilayer circuit board according to claim 4, wherein
the chip inductor comprises chip inductors on both sides of two microstrip lines arranged in parallel, each of the two microstrip lines comprising the microstrip line, and
the signal transmission characteristic compensation portion comprises signal transmission characteristic compensation portions at positions aligned in respective extending directions of the two microstrip lines and separated from each other by a predetermined distance in a direction orthogonal to the respective extending directions, the signal transmission characteristic compensation portions being situated below mounting pads on the microstrip lines, each of the mounting pads comprising the mounting pad and being connected to an end of a corresponding one of the chip inductors.

14. The multilayer circuit board according to claim 2, wherein
the chip inductor comprises chip inductors on both sides of two microstrip lines arranged in parallel, each of the two microstrip lines comprising the microstrip line, and
the signal transmission characteristic compensation portion comprises signal transmission characteristic compensation portions below mounting pads on the microstrip lines, each of the mounting pads comprising the mounting pad and being connected to an end of a corresponding one of the chip inductors, such that one of the signal transmission characteristic compensation portions below one of the mounting pads is located at a position shifted from an other of the signal transmission characteristic compensation portions and separated from the other of the signal transmission characteristic compensation portions by a predetermined distance in respective extending directions of the two microstrip lines and is separated from one of the microstrip lines having an other of the mounting pads in a direction orthogonal to the respective extending directions.

15. The multilayer circuit board according to claim 3, wherein
the chip inductor comprises chip inductors on both sides of two microstrip lines arranged in parallel, each of the two microstrip lines comprising the microstrip line, and
the signal transmission characteristic compensation portion comprises signal transmission characteristic compensation portions below mounting pads on the microstrip lines, each of the mounting pads comprising the mounting pad and being connected to an end of a corresponding one of the chip inductors, such that one of the signal transmission characteristic compensation portions below one of the mounting pads is located at a position shifted from an other of the signal transmission characteristic compensation portions and separated from the other of the signal transmission characteristic compensation portions by a predetermined distance in respective extending directions of the two microstrip lines and is separated from one of the microstrip lines having an other of the mounting pads in a direction orthogonal to the respective extending directions.

16. The multilayer circuit board according to claim 2, wherein
both or one of the signal transmission characteristic compensation portion and the inductor characteristic compensation portion includes a conductive mesh in which conductors are positioned in a mesh with a dielectric interposed therebetween.

17. The multilayer circuit board according to claim 3, wherein
both or one of the signal transmission characteristic compensation portion and the inductor characteristic compensation portion includes a conductive mesh in which conductors are positioned in a mesh with a dielectric interposed therebetween.

18. The multilayer circuit board according to claim 2, wherein
both or one of the signal transmission characteristic compensation portion and the inductor characteristic compensation portion includes a resistive film.

19. The multilayer circuit board according to claim 3, wherein
both or one of the signal transmission characteristic compensation portion and the inductor characteristic compensation portion includes a resistive film.

20. The multilayer circuit board according to claim 2, wherein
both or one of the signal transmission characteristic compensation portion and the inductor characteristic compensation portion partially includes one or a plurality of floating island-shaped conductors insulated from the inner-layer ground.

\* \* \* \* \*